(12) United States Patent
Aton

(10) Patent No.: US 7,906,271 B2
(45) Date of Patent: Mar. 15, 2011

(54) SYSTEM AND METHOD FOR MAKING PHOTOMASKS

(75) Inventor: Thomas J. Aton, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 671 days.

(21) Appl. No.: 11/863,717

(22) Filed: Sep. 28, 2007

(65) Prior Publication Data

US 2009/0087754 A1  Apr. 2, 2009

(51) Int. Cl.
*G03C 5/00* (2006.01)

(52) U.S. Cl. ............ 430/312; 430/5; 430/313; 430/316; 430/328

(58) Field of Classification Search .............. 430/5, 313, 430/312, 316, 328

See application file for complete search history.

(56) References Cited

U.S. PATENT DOCUMENTS

2004/0063038 A1* 4/2004 Shin et al. .................... 430/311

OTHER PUBLICATIONS

Aton, U.S. Appl. No. 11/771,515, filed Jun. 29, 2007.
O'Brien, U.S. Appl. No. 11/531,048, filed Sep. 12, 2006.
Aton, U.S. Appl. No. 11/863,753, filed Sep. 28, 2007.
Aton, U.S. Appl. No. 11/940,990, filed Nov. 15, 2007.
Aton, U.S. Appl. No. 11/940,016, filed Nov. 14, 2007.
Aton, U.S. Appl. No. 11/940,245, filed Nov. 14, 2007.
Aton, U.S. Appl. No. 11/940,194, filed Nov. 14, 2007.
Aton, U.S. Appl. No. 11/940,270, filed Nov. 14, 2007.

* cited by examiner

*Primary Examiner* — Christopher G Young

(74) *Attorney, Agent, or Firm* — Warren L. Franz; Wade J. Brady, III; Frederick J. Telecky, Jr.

(57) ABSTRACT

The present disclosure is directed a method for preparing a system of photomask patterns for implementing a drawn pattern on a substrate with a multi-patterning lithography process. The method comprises receiving data describing a drawn pattern. A first photomask pattern is formed for implementing a region of the drawn pattern on the substrate. A second photomask pattern is formed comprising one or more pattern features having longitudinal edges for implementing the region of the drawn pattern on the substrate, wherein at least 90% of all the longitudinal edges of the second photomask pattern that are positioned within the region are oriented in substantially the same direction. Both a system for forming the photomask patterns and a process for patterning a device using the photomask patterns are also disclosed.

2 Claims, 7 Drawing Sheets

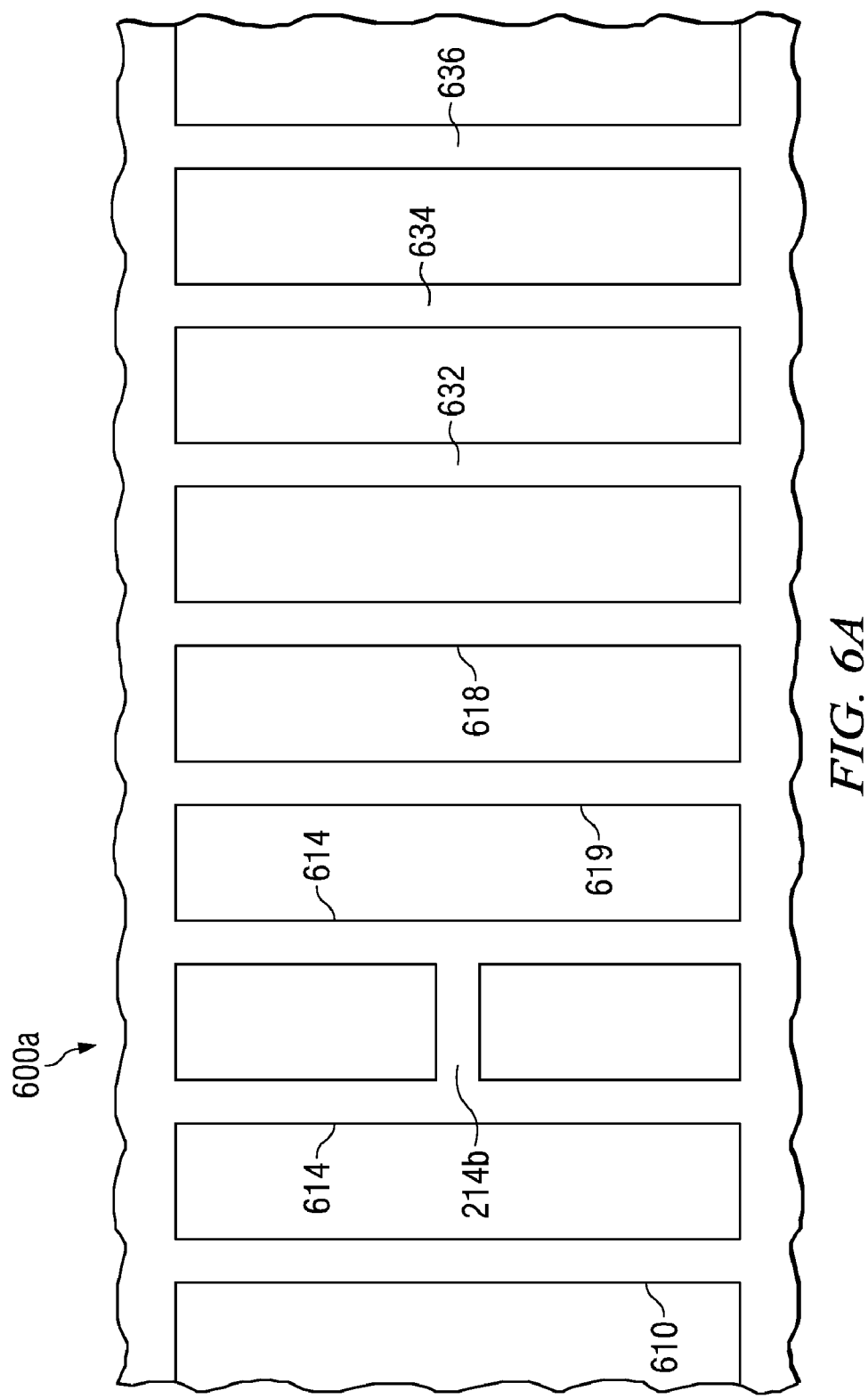

SYSTEM AND METHOD FOR MAKING PHOTOMASKS

FIELD OF THE DISCLOSURE

The present application relates generally to the field of photolithography, and more specifically to a method and system for preparing a pattern for a photomask.

BACKGROUND OF THE DISCLOSURE

Conventional optical projection lithography has been the standard silicon patterning technology for the past 20 years. It is an economical process due to its inherently high throughput, thereby providing a desirable low cost per part or die produced. A considerable infrastructure (including steppers, photomasks, resists, metrology, etc.) has been built up around this technology.

In this process, a photomask, or "reticle", includes a semiconductor circuit layout pattern typically formed of opaque chrome, on a transparent glass (typically $SiO_2$) substrate. A stepper includes a light source and optics that project light coming through the photomask to image the circuit pattern, typically with a 4× to 5× reduction factor, on a photo-resist film formed on a wafer. The term "chrome" refers to an opaque masking material that is typically but not always comprised of chrome. The transmission of the opaque material on the photomask may also vary, such as in the case of an attenuating phase shift mask.

The process of making the photomask begins by receiving data from a design database. The design database contains data describing at least a portion of an integrated circuit design layout, referred to as the "drawn" pattern, which generally provides a target pattern that the designers wish to achieve on the wafer. Techniques for forming design databases are well known in the art.

After receiving the design database, mask makers form one or more photomasks that can be used to implement the target pattern described by the design data. This mask making process may generally include generating mask pattern data describing initial photomask patterns for forming device features. The initial photomask patterns are formed by employing various resolution enhancement techniques. The resolution enhancement techniques can include splitting the drawn pattern so that it is patterned using two or more photomasks, such as a phase shift mask and a trim mask, for use in an alternating phase shift process ("altPSM"). Alternating phase shift processes may also be referred to as strong phase shift or Levinson phase shift technologies. Such resolution enhancement techniques for forming initial photomask patterns from design data are well known in the art.

After the initial photomask patterns are formed, a proximity correction process is carried out that corrects the mask pattern data for proximity effects. The proximity correction process generally involves running proximity correction software to perform calculations that alter the shape of the initial photomask pattern to take into account proximity effects, such as optical diffraction effects that occur during the imaging process. In this method, a computer simulation program is often used to compute image-like model values that are taken to represent the features formed for a particular photomask feature pattern or group of patterns. Based on these simulated model values, the photomask pattern can be altered and then simulated again to determine if the altered pattern will improved the printed features. This process can be repeated until the result is within desired specifications. The features added to a photomask pattern based on this procedure are called optical proximity correction features.

After proximity correction has been performed, verification of the mask pattern data can be performed. This can include running various quality checks to determine whether the photomask patterns generated will form the desired pattern for implementing the circuit specified in the drawn data. The mask pattern data can then be sent to a mask shop, where the actual photomasks are fabricated from the mask pattern data.

One of the most common commercial implementations of alternating phase shift mask technology is the double exposure method. In this method, the critical device features to be patterned are imaged during a first exposure using a first mask, such as a phase shift mask. The non-critical and other secondary features are imaged in a second exposure using second mask, such as a conventional chrome-on-glass mask. In the past, both the first and second exposures were performed on the same photoresist layer.

More recently, a new process has been developed, referred to herein as two-print/two-etch ("2p/2e") or "double patterning," in which the first exposure and second exposure are each performed on separate photoresists. The patterns from each of the photoresists can be individually transferred to, for example, a hardmask. In some processes, rather than employing a hardmask, the first and second patterns from the first and second exposures can be transferred directly to the wafer in two separate etch steps.

In an exemplary 2p/2e processes, a phase pattern may be formed in a first photoresist. The phase pattern can then be transferred to a hardmask using an etching technique and the first photoresist removed. A trim pattern can then be formed in a second photoresist and the resulting photoresist pattern is then transferred to the hardmask using a second etching step. Subsequently, the hardmask pattern, having both the phase and trim patterns etched therein, can be used to etch the wafer.

In the past, especially when the first mask of the 2p/2e process was an alternating phase reticle, some inherent properties of the phase mask would form certain features in the resist that, if fully transferred to the layer being formed, were not essential to, or might interfere with, its function. Certain other features may also have been defined by the first mask that have substantially no electrical significance to the circuit, but were employed to improve critical dimension control when forming semiconductor devices by removing or minimizing the differences in OPC and responses to process variations. We shall refer to these features as "ghost features" because they were removed with the processing of the second mask (sometimes called a trim mask because it "trimmed" these features away).

In 2p/2e processes, the removal of the ghost features by the second mask can cause difficulties in patterning. For example, the patterns on the second mask that are used to remove the ghost features can have very small dimensions, and may require employing assist features, such as sub-resolution assist features ("SRAFs"). SRAFs provide diffraction support and are generally well known in the art, as described, for example, in pending U.S. patent application Ser. No. 11/531,048, entitled "Method for achieving compliant sub-resolution assist features," by Sean O'Brien, the disclosure of which is herein incorporated by reference in its entirety. The placement of the assist features to provide the requisite diffraction support for the patterns used to remove the ghost features may interfere with the placement of other assist features used to provide diffraction support for other substantially important second mask pattern features. Further, the patterns on the second mask used to remove the ghost poly can result in complicated shapes on the second mask. As densities of integrated circuit devices increase, achieving the complicated patterns can be difficult. Accordingly, to achieve increased densities of integrated circuit devices further innovations relating to the 2p/2e processing techniques are desired.

SUMMARY OF THE DISCLOSURE

In accordance with the disclosure, an embodiment of the present teachings is directed a method for preparing a system of photomask patterns for implementing a drawn pattern on a substrate with a multi-patterning lithography process. The method comprises receiving data describing a drawn pattern. A first photomask pattern is formed for implementing a region of the drawn pattern on the substrate. A second photomask pattern is formed comprising one or more pattern features having longitudinal edges for implementing the region of the drawn pattern on the substrate, wherein at least 90% of all the longitudinal edges of the second photomask pattern that are positioned within the region are oriented in substantially the same direction.

Another embodiment of the present application is directed to a multi-pattern process for patterning a device. The process comprises providing a substrate, forming a layer on the substrate, and applying a first photoresist over the layer. The first photoresist is exposed to radiation through a first photomask and developed to form a first pattern. An etching process is carried out to transfer the first pattern into the layer. The first photoresist is removed. A second photoresist is applied over the layer. The second photoresist is exposed to radiation through a second photomask and developed to form a second pattern. An etching process is carried out to transfer the second pattern into the layer, and the second photoresist is removed. The first and second photomasks of this process comprise patterns that are prepared by a method comprising receiving data describing a drawn pattern; forming a pattern for the first photomask for implementing a region of the drawn pattern on the substrate; and forming a pattern for the second photomask. The second photomask pattern comprises one or more pattern features having longitudinal edges for implementing the region of the drawn pattern on the substrate, wherein at least 90% of all the longitudinal edges of the second photomask pattern that are positioned within the region are oriented in substantially the same direction.

Additional objects and embodiments of the disclosure will be set forth in part in the description which follows, and can be learned by practice of the disclosure. It is to be understood that both the foregoing general description and the following detailed description are exemplary and explanatory only and are not restrictive of the disclosure, as claimed.

BRIEF DESCRIPTION OF THE DRAWINGS

The accompanying drawings, which are incorporated in and constitute a part of this specification, illustrate several embodiments of the disclosure and, together with the description, serve to explain the principles of the disclosure.

FIG. 6A illustrates a pattern formed on a substrate using the photomask pattern illustrated in FIG. 3, according to an embodiment of the present application.

DESCRIPTION OF THE EMBODIMENTS

Reference will now be made in detail to various exemplary embodiments of the present application, examples of which are illustrated in the accompanying drawings. Wherever possible, the same reference numbers will be used throughout the drawings to refer to the same or like parts.

Figure 1:
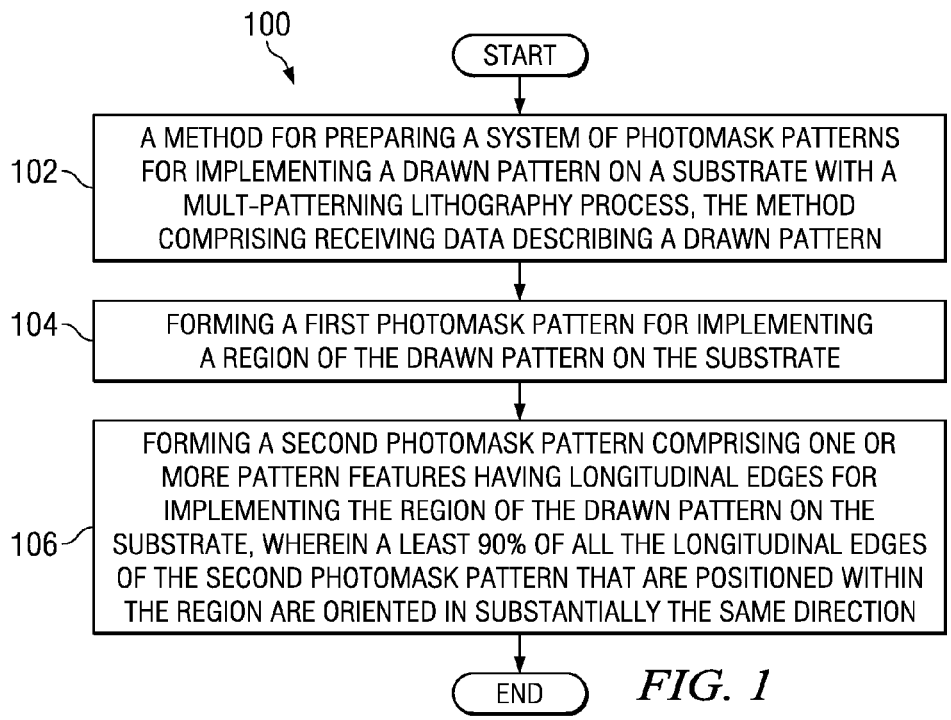
FIG. 1 illustrates a flow diagram of a multi-pattern process for making photomask patterns, according to an embodiment of the present disclosure.

FIG. 1 illustrates a flow diagram 100 of a process for preparing photomask patterns, according to an embodiment of the present disclosure. It should be readily apparent to those of ordinary skill in the art that the flow diagram 100 depicted in FIG. 1 represents a generalized schematic illustration and that other steps may be added or existing steps may be removed or modified.

As illustrated at 102 of flow diagram 100, the process includes receiving data describing a drawn pattern layout. The drawn pattern layout can be for any device that is patternable using lithographic methods, such as MEMS devices, integrated circuits, electron emitters, and other such devices. In an embodiment of the present application, the drawn pattern layout is a gate level pattern for an integrated circuit.

The drawn pattern layout can include regions of varying pattern design. For example, some integrated circuit pattern layouts may include regions dedicated to patterning logic circuits on a substrate, regions dedicated to patterning memory circuits, such as for random access memory or read only memory (ROM), and other regions. The circuits formed on the substrate within the differing patterned regions may be oriented in different directions relative to each other. In addition, the varying pattern density and design can result in different lithographic techniques being employed to pattern the different regions. For example, very dense regions of a pattern layout, where critical dimensions are small, may be patterned using the multi-patterning techniques of the present application. However, other regions of the pattern layout could potentially be patterned with a single mask.

Some regions of the drawn pattern can include one or more dummy feature patterns having longitudinal edges oriented in a desired direction. The direction can be any suitable direction. In an embodiment, the longitudinal direction of the edges of the dummy features run parallel with longitudinal edges of device patterns formed adjacent to the dummy feature patterns. The term "longitudinal edge" as used herein is defined to mean the longest edge or edges of a polygon and any edge of that polygon that is parallel with the longest edge(s).

The term dummy feature is generally well known in the art, and includes features formed on a substrate that are not considered a functional part of the circuit, but which remain on the substrate. The term dummy feature, as used herein, can be broadly interpreted as referring to a non-functional structure used to improve the critical dimension control when forming semiconductor devices by removing or minimizing the differences in OPC and responses to process variations. In most cases, the dummy features are formed next to a feature that remains on the substrate. For example, a dummy feature, such as a dummy gate, can be formed at the end of an array of gates so that the environment of the gates at the end of the array of gates is similar to the environment of the gates in the interior of the array of gates during lithography and/or etching processes. Dummy features can be used to reduce the critical dimension variation, such as for gates at the end of an array of gates. In one embodiment, the dummy features can be similar to the ghost features described above, except that the dummy features are not removed, but remain on the substrate.

Figure 7:
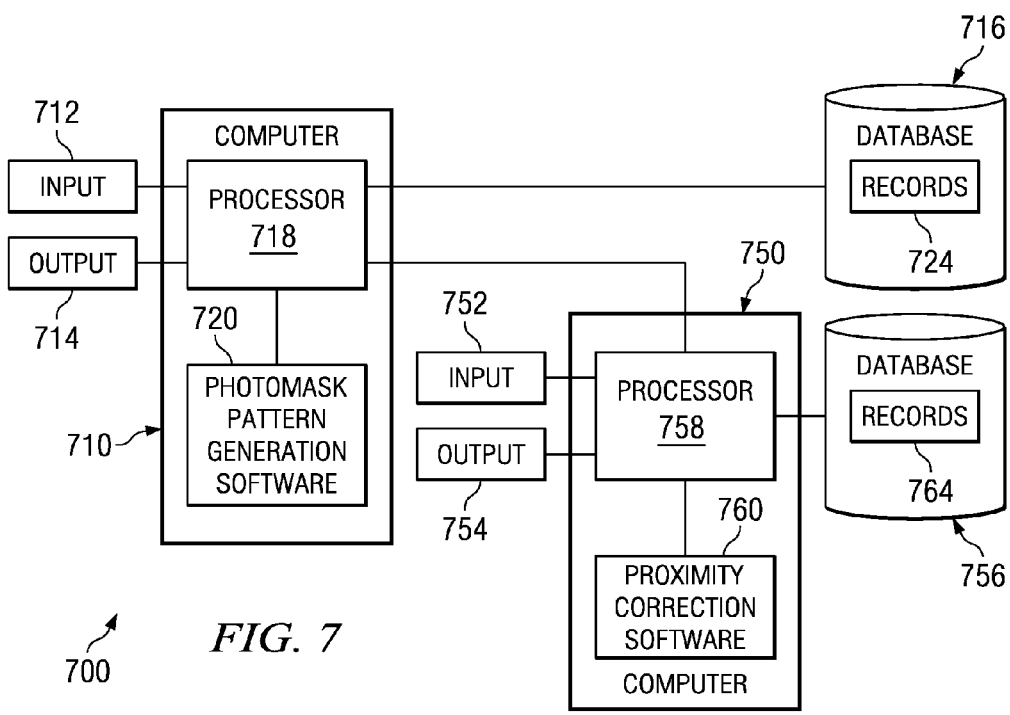
FIG. 7 illustrates an embodiment of a computer system used to form the photomask patterns of the present application.

Referring again to 102 of FIG. 1, the drawn pattern data can be received by a computer system used to form the photomask patterns, such as the one illustrated in FIG. 7 below. The computer system can include computer readable software for generating the desired photomask patterns based on the drawn data that is received. As also illustrated in FIG. 7 and described in greater detail below, the software can include photomask pattern generation software 720 and proximity correction software 760. In embodiments, portions of the process of flow chart 100 can also be carried out by proximity correction software 760, as will be described below.

After receiving the drawn pattern data, the process further includes forming a first photomask pattern for implementing a region of the drawn pattern, as described at 104 of FIG. 1, using, for example, the photomask pattern generation software 720 of FIG. 7. For example, the first photomask pattern can include pattern edges designed so that when implemented on a photomask, they can be used to pattern the longitudinal edges of the dummy feature patterns on a substrate during a first exposure and etch process, as will be discussed in greater detail below. The first exposure and etch process is part of a multi-patterning process. As will also be discussed in greater detail below with reference to FIG. 5, the substrate can have a first layer formed thereon that can be, for example, a hardmask or a device layer, depending on the multi-patterning process employed.

Processes that employ multiple photomasks in multiple etch processing are referred to herein as "multi-pattern processing". In multi-pattern processing, the mask scheme partitions the drawn pattern to be implemented on the substrate into at least two patterns that will be formed on at least two separate photomasks. Thus, during fabrication of the device, at least a first and a second photomasks must be separately aligned with the substrate during two separate exposures to form the desired pattern on the wafer. During the first exposure and etch process, some of the edges of the drawn pattern are formed; and during the second exposure and etch process, the additional edges of the drawn pattern can be formed.

One example of such multi-pattern processing is the 2p/2e process discussed above, where a device pattern is implemented using two photomasks that are employed to image two separate photoresists. However, processes that employ three or more photoresist patterning processes and/or three or more etch processes are also contemplated.

Referring to FIG. 1 at 106, the second photomask pattern can include pattern features having longitudinal edges for implementing the region of the drawn pattern on the substrate. For example, the pattern features can be designed to remove portions of a layer formed on the substrate in a region proximate the dummy features, described above, during the second exposure and etch process of the multi-patterning process. These pattern features can be designed to be, for example, clear regions on the photomask that allow radiation to impinge on the photoresist during the exposure step so that the photoresist is removed when it is developed.

The term "region," as used herein, can be, for example, an area of the pattern layout that includes regularly spaced device feature patterns that generally run in the same direction, such as for forming one or more arrays of gates or metal lines. In an embodiment, the region can include the entire area of a pattern layout over which dummy feature patterns and gate patterns are formed to generally run in the same direction. For example, in some embodiments of the present application, the dummy feature patterns can be designed to form dummy gates on the substrate between arrays of gates to establish a desired gate pitch. In certain regions of the substrate, the arrays of gates and dummy features can be formed so as to have longitudinal axes running in a first direction, while in other regions of the substrate, the arrays of gates and dummy features can be formed to have longitudinal axes running in another direction. In such embodiments, the pattern features at 106 of flow chart 100 are designed to remove portions of a layer formed on the substrate in a region proximate the dummy features, where the region would include substantially the entire area of the drawn pattern layout in which all or substantially all of the arrays of gate patterns and dummy feature patterns are positioned to run in the first direction, but would not necessarily include any surrounding areas of the drawn pattern layout outside of that area. In one embodiment, the region comprises at least 10% of the area of the drawn pattern layout, as it is implemented on a substrate. In another embodiment, the region comprises at least 25% of the area of the drawn pattern layout, as implemented on a substrate. In a third embodiment, the region can comprise the peripheral circuits that drive a block of any one of various memory circuit elements (e.g., RAM, SRAM, ROM, etc) implemented on a substrate. In a fourth embodiment, the region can comprise a block of logic circuits that execute Boolean logic functions as, for example, a block of so-called standard cell logic or gate array logic. In yet another embodiment, the region can be any portion of the substrate where the elements are patterned near the limit of the lithographic capability of the patterning system.

The second photomask pattern can also comprise second pattern features designed to cover, and thus maintain, during the second exposure, development and etch, the dummy features formed using the first photomask pattern of block 104 of FIG. 1. These second photomask pattern features can be designed to be, for example, opaque regions on the photomask that block radiation during the exposure step so that a photoresist layer remains on the dummy features after the photoresist is developed. The photoresist can protect the dummy features so that they are not removed during the etch process.

In other embodiments, depending on the type of photoresist that is employed, the first pattern features can be opaque and the second pattern features can be clear, so long as the dummy features are allowed to remain on the wafer and the desired portions of the first layer are removed during the second exposure and etch process.

In embodiments, the first photomask pattern 104 can include second pattern features having longitudinal edges oriented in a second direction that is different from the orientation of the longitudinal edges of the pattern features at 106. In general, the second direction can be chosen to form additional edges of the drawn pattern that are not formed by the second photomask. In one embodiment, the second direction is at approximately a 90 degree angle relative to the direction of orientation of the longitudinal edges of the pattern features at 106.

In some embodiments, at least 90% of the longitudinal edges of the second photomask pattern are oriented in the same direction, as shown at 106 of FIG. 1. For example, at least 95% of the longitudinal edges can be oriented in the same direction. In one embodiment, all or substantially all of the longitudinal edges of the second photomask pattern are oriented in the same direction.

After the first and second photomask patterns are generated at 104 and 106 of flow chart 100, additional processing of the patterns can be carried out to, for example, correct the mask patterns for proximity effects and prepare the patterns to send to the mask manufacturer. The mask manufacturer then writes the photomasks, which can be used to manufacture integrated circuit devices.

The processes of the present application may apply to making any suitable type of photomask that can be used in a multi-pattern process. For example, in one embodiment, the process is directed to alternating phase shift technologies using phase and trim masks. In other embodiments, the processes of the present application may be implemented using binary masks, embedded attenuated phase shift masks, hard phase shift masks, double-dipole exposure masks, or any other type of mask that can be used in a multi-pattern process.

Figure 2:
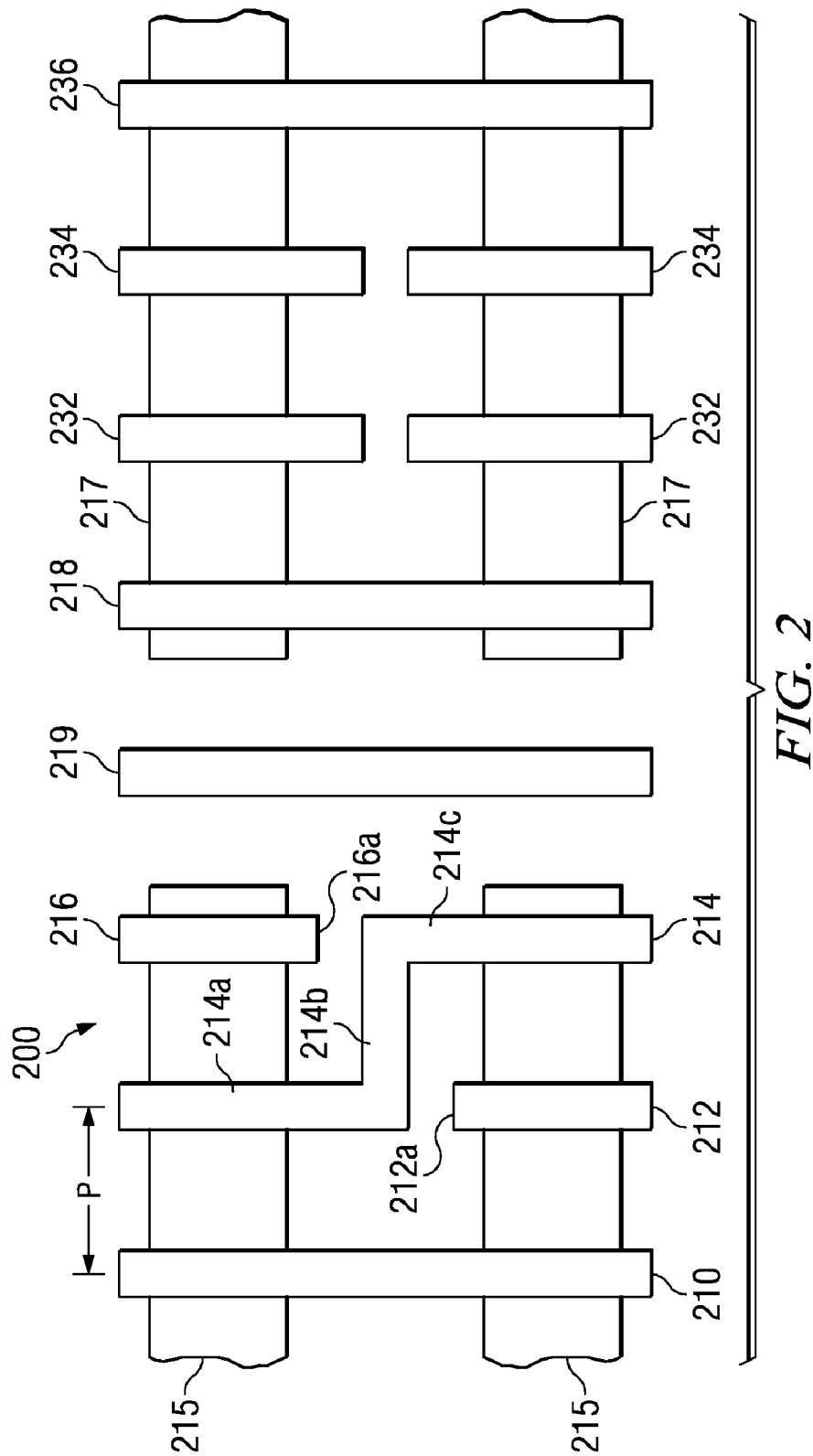
FIG. 2 illustrates a drawn pattern, according to an embodiment of the present application.

FIGS. 2, 3, 4A and 4B illustrate an embodiment of a method of preparing a system of photomask patterns for implementing a drawn pattern on a substrate, according to the present disclosure. FIG. 2 illustrates a drawn pattern 200 that includes a broken-H gate, which may also be known as a cross-over gate, cross-coupled gate or twist-gate. The drawn pattern 200 includes polygon shaped pattern segments 212, 214, and 216 for patterning the broken-H gate. Pattern segment 214 includes two gate patterns 214a and 214c, at least portions of which gate patterns are formed over active regions 215. Gate patterns 214a and 214c are electrically coupled together by an interconnect 214b, which is formed over a field region of the substrate. Such broken-H gates are well known in integrated circuit fabrication.

Drawn pattern 200 can also include pattern segments, such as 210, 218, 232, 234, and 236, for forming gates on either side of the broken-H gate. Drawn pattern segments 218, 232, 234 and 236 are formed over a separate active region 217 then the other gate structures. Segment 219 is a dummy gate formed between the active regions 215 and 217. Dummy gate 219 allows the gate pitch, P, of the drawn pattern to remain relatively constant between the gates of the arrays of gates formed over active regions 215 and 217, as shown in FIG. 2. Gate pitch can be defined as the distance between the central longitudinal axes of adjacent gates. A constant or nearly constant gate spacing between gates on a wafer can result in improvements in critical dimension control of the lithographic process, etching process and other processes.

Figure 3:
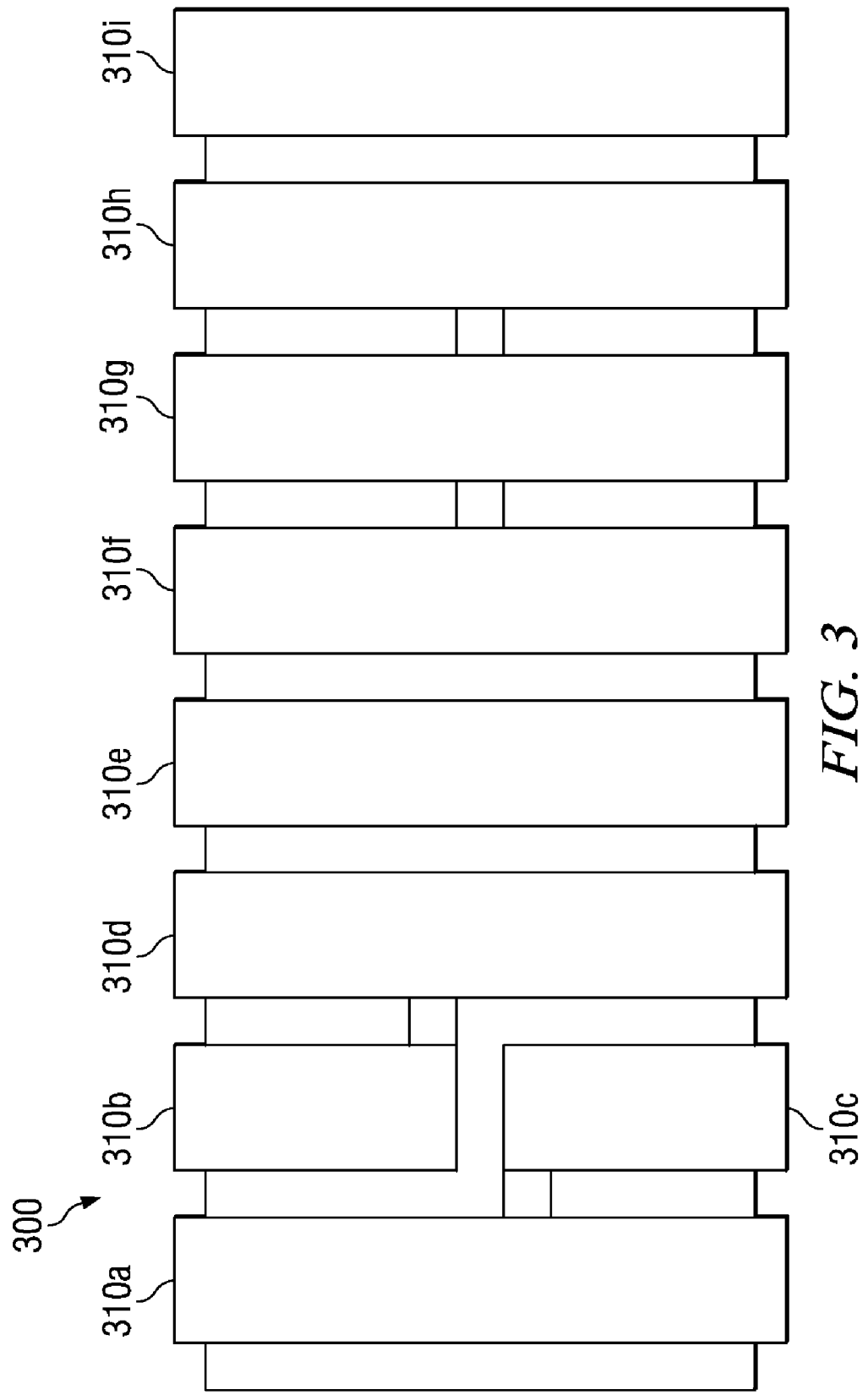
FIG. 3 illustrates an embodiment of a first pattern for forming the drawn pattern of FIG. 2, according to an embodiment of the present application.

FIG. 3 illustrates an embodiment of a first pattern 300 for forming a first mask for implementing the drawn pattern of FIG. 2. First pattern 300 is illustrated as a phase pattern, such as can be used for forming an alternating phase shift mask. However, the first mask pattern is not limited to a phase mask pattern, and any type of pattern for forming any type of mask suitable for use in multi-pattern processing, including embedded attenuating phase shift masks, binary masks and dipole masks can be used. For illustrative purposes, the gate structures of drawn pattern 200 are also illustrated in FIG. 3, but would not be considered as part of first pattern 300. Phase blocks 310a to 310i of first pattern 300 are placed so as to define the longitudinal edges of the drawn pattern, similarly as shown, and thereby also define the critical dimensions of the drawn pattern, which in this case are gate lengths.

Figure 4B:
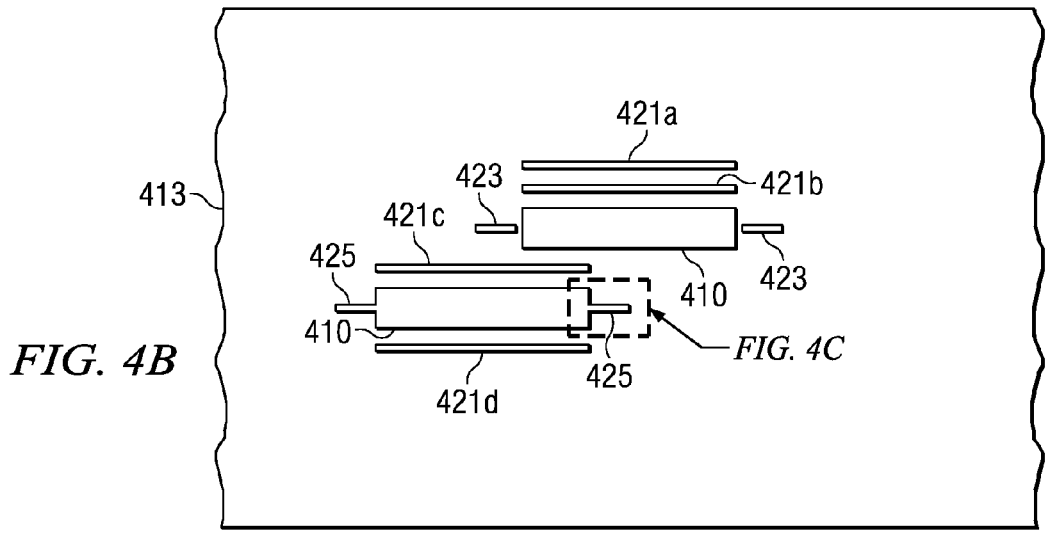
FIGS. 4A to 4C illustrate a second pattern for forming the drawn pattern of FIG. 2, according to an embodiment of the present application.
Figure 4C:
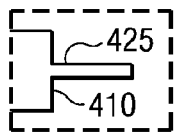
Figure 4A:
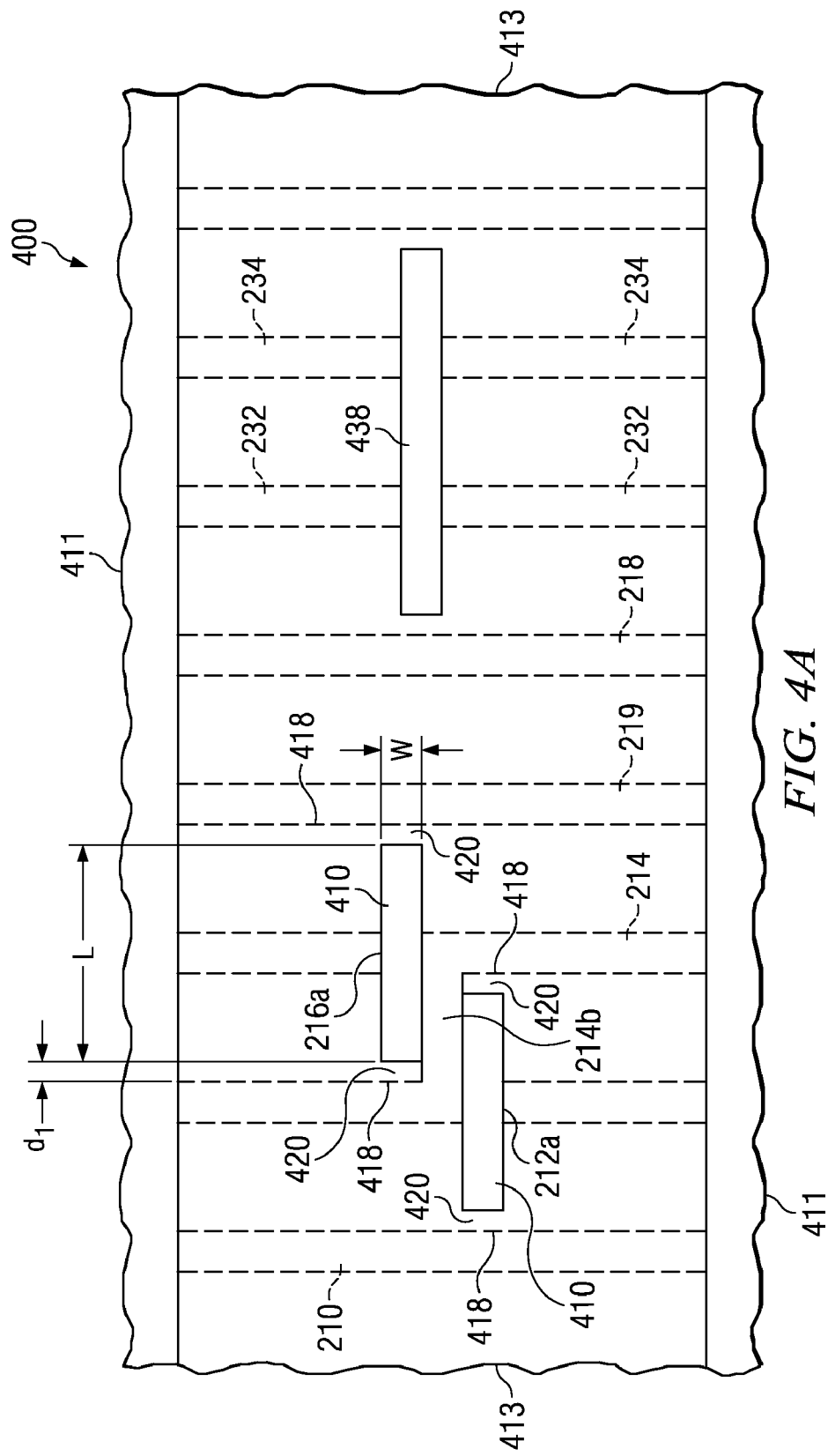

FIG. 4A illustrates a second pattern 400, forming a second mask that can be used in conjunction with the first mask of FIG. 3 in a multi-pattern process for implementing the drawn pattern of FIG. 2, according to an embodiment of the present application. In one embodiment, second pattern 400 is designed for forming an embedded attenuated mask. However, second pattern 400 can be any suitable pattern for forming any type of mask suitable for use in multi-pattern processing, including phase shift masks, binary and dipole masks. Second mask 400 includes second mask patterns 410 for defining edges 212a, 216a, and portions of the edges of 214b, of the drawn pattern. Second mask 400 also includes other patterns, such as pattern 438 for defining the ends of gate patterns 232 and 234; and patterns 411 for defining the ends of the gate structures 210, 212, 214, 216, 218, 232, 234, 236 and dummy gate 219.

As will be discussed in greater detail below, second mask patterns 410 and 411 are designed to result in the removal of portions of a patterned first layer, illustrated in FIG. 6A, which is previously formed by employing the first pattern of FIG. 3 in a substrate patterning process. As will also be discussed in greater detail below, second mask 400 also includes a region 413 that is designed to maintain portions of FIG. 6A, in order to form the gate structures and dummy gate of drawn pattern 200.

In an embodiment of the present application, second patterns 410 can be positioned a distance, $d_1$, from vertical edges 418 of drawn pattern segments 210, 214 and dummy gate 219. This results in wings 420 being formed between the second patterns 410 and portions of the vertical edges of drawn segments 210, 214 and 218, as illustrated. Wings 420 can protect edges 418 from double patterning by both the first and second masks, as explained in greater detail in Pub. No. US 2009/0087619 A1, the disclosure of which is incorporated herein by reference in its entirety.

The distance, $d_1$, that defines the width of wings 420 in the above embodiments may be chosen to be any suitable distance that will provide a desired degree of protection from double patterning. The distances chosen may vary depending on the misalignment tolerances for the lithography system being employed, the acceptable tolerances for patterning error of a particular pattern segment, and any potential detrimental effects of increasing the size of the wings. Exemplary ranges for $d_1$ can range from about 2 nm to about 100 nm, such as about 5 nm to about 35 nm, or about 10 nm to about 25 nm. As stated, these ranges are exemplary only, and values for $d_1$ outside of these ranges are also contemplated, depending on, for example, the misalignment tolerances of the lithography system, as well as other factors, such as those described above.

The dimensions disclosed for $d_1$ and $d_2$, as well as all dimensions disclosed herein unless otherwise expressly stated, are based upon the size of the pattern to be formed on the wafer. The actual dimensions for $d_1$ and $d_2$ for the photomask patterns will vary depending upon the size of the reduction factor of the photomask. As discussed above, photomasks are often formed to have, for example, a 4× or 5× reduction factor, meaning that the photomask pattern dimensions can be about 4 or 5 times larger then the corresponding dimensions formed on the wafer. Similarly, the dimensions of the drawn pattern may or may not also have a reduction factor. Therefore, as one of ordinary skill in the art would readily understand, the mask sizes and the drawn pattern sizes can correspond to the wafer dimensions based on any suitable reduction factor, including where the dimensions on the mask and/or drawn pattern dimensions are intended to be the same as those formed on the wafer.

FIG. 4A can also include other pattern features. For example, FIG. 4B illustrates another view of second patterns 410 of FIG. 4A, with sub-resolution assist features ("SRAFs") 421, 423 and 425. As is well known in the art, such SRAFs are generally designed to be too small to print a pattern themselves, but can provide diffraction support that can result in improved depth of focus for printing the patternable features.

The number of SRAFs illustrated in FIG. 4B and the positioning of the SRAFs are for illustrative purposes only. Any suitable number of SRAFs can be used. The SRAFs can be positioned in any suitable manner so as to provide the desired diffraction support. In some embodiments, multiple SRAFs, such as SRAFs 421a and 421b, can be employed on a single side of a second pattern 410. In other embodiments, a single SRAF can be used proximate a side of second patterns 410, as in the case of SRAFs 421c and 421d. In embodiments, SRAF 423 and/or SRAF 425 can also be positioned on the ends of second patterns 410. The SRAFs can be positioned so as not to physically contact second patterns 410, as in the case of SRAF 423. Alternatively, the SRAFs can be positioned in contact with, and form an extension of, second patterns 410, as in the case of SRAF 425, which is more clearly illustrated in FIG. 4C.

Generally speaking, forming SRAFs as an extension of patterns to be printed is generally not considered acceptable practice, as it may cause a portion of the SRAF to print and/or cause a distortion of the pattern that is being printed. However, due to the existence of wings 420 at the ends of second patterns 410, non-printing SRAFs 425 join printing pattern 410 at a non-critical edge for the mask. That is to say that the ends of second patterns 410 merely pattern a resist edge on the wafer where the gate pattern has already been correctly patterned for CD using the first mask. The wings 420 are thus not important to device function, and in many instances, may not even define an edge of the pattern that is actually printed in the final wafer pattern. Because SRAFs 425 are formed so as to extend a portion of these non-critical edges of second patterns 410, the distortion of the pattern resulting from the joining of SRAFs 425 may be considered acceptable, or the pattern can be adjusted to account for any such distortion by the OPC or other data processing software.

Positioning SRAFs 425 as extensions of second patterns 410 can provide some lithographic advantages in patterning second patterns 410. For example, SRAFs 425 may make it easier to control the lithography and make it more likely that second patterns 410 will print in an acceptable manner. As discussed above, second patterns 410 can be difficult to pattern. This is partly due to the relatively small dimensions of second patterns 410. For example, in the embodiment of FIG. 4, the longitudinal edges of the pattern 410 can have a length, L, that is less than or equal to (2 gate pitch)–gate width. The width dimension, W, of 410 will usually be made as small as is practical to improve the density of such structures on the patterned wafer. Such patterns, small in both dimensions, are difficult to control through focus because of diffraction and proximity effects. Hence, features 410 can be fully diffraction supported by other features 410, or by SRAFs that parallel them, for best process yield.

In many situations, second patterns 410 will be too close to each other to allow insertion of SRAFs, such as 421c, between the second patterns. Each second pattern 410 can then provide diffraction support for another. However, if patterns 410 are offset, such as to produce the cross-coupled gate structure, as shown in FIG. 4A, SRAF features like 423 or 425 can provide the necessary diffraction support for the "uncovered" piece of a pattern 410 where one pattern 410 does not have another pattern 410 projecting on it.

A feature of an embodiment of the current disclosure is that the dummy feature 219 of FIG. 1 not be removed by the second exposure etch step. In conventional processes, such electrically inactive features are often removed. However, removing feature 219 would require opening another slot in the second mask 400, the slot being substantially perpendicular to the longitudinal edges of the second patterns 410 that are shown in FIG. 4. Such a slot for removing dummy feature 219 would, of necessity, be substantially narrow to keep its removal region from interfering with gates 216, 214c, and 218 and their underlying active regions 215 and 217. Hence such a slot would also require diffraction-support SRAFs if it were to be well controlled for focus, diffraction and proximity effects during exposure and patterning. These SRAFs, being necessarily parallel to the slot to remove dummy feature 219 and perpendicular to any SRAFs (421, 423, 425) that support the printing of second patterns 410, would interfere with placement of sufficient SRAFs to correctly pattern the second pattern 410. Additionally, forming patterns oriented in different directions generally complicates the lithography process.

Hence, an embodiment of the present disclosure is that at least 90% of the longitudinal edges of the printable patterns of second mask 400 be formed in the same direction, which in one embodiment, is in a direction that is substantially perpendicular to the longitudinal features of the gate and dummy patterns of pattern 200. The printable patterns having longitudinal edges to be formed in the same direction can include, for example, the second patterns 410, which are used to open cuts between gates near edges 212a and 216a, as well as patterns 411 and 438, which cut off ends of the lines 210, 212, 214 218, 219, 232, 234, and 236, as shown in FIG. 4A.

As described above, in some embodiments at least 95% of the longitudinal edges of the printable patterns of second mask 400 can be oriented in the same direction. In other embodiments, all or substantially all of the longitudinal edges of the second photomask pattern are oriented in the same direction.

Similarly as described above, after the first and second patterns are generated, additional processing of the patterns is carried out to, for example, correct the photomask patterns for proximity effects and prepare them to send to the mask manufacturer. The mask manufacturer then writes the first and second masks, which can be used to manufacture integrated circuit devices.

Figure 5:
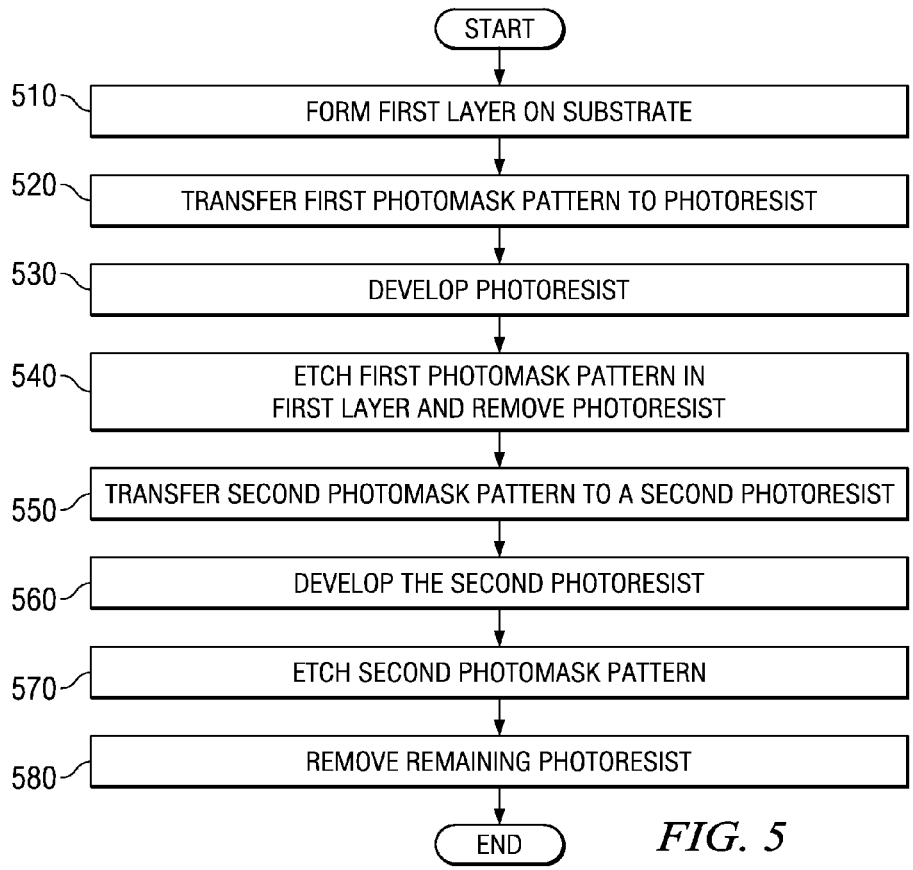
FIG. 5 illustrates an exemplary method for forming a semiconductor device using photomasks, according to an embodiment of the present application.

An exemplary method 500 for forming a semiconductor device using the photomasks of the present application is shown in FIG. 5. At 510, a first layer, including one or more of a hardmask and a device layer, can be formed on a substrate. The device layer can include any desired material suitable for making the desired device, including conductive materials, such as metals, silicides and doped polysilicon, and semiconducting and insulating materials, such as undoped polysilicon, oxides, and nitrides. In an embodiment, the device layer includes at least one material chosen from metals and polysilicon.

A photoresist layer can be formed on the first layer. At 520, a beam of radiation can be used to transfer the pattern of a first photomask that includes target pattern features to the photoresist. For example, a phase shift mask including first pattern 300, shown in FIG. 3, can be used to transfer a first photomask pattern to the photoresist.

At 530 of FIG. 5, the photoresist with the imaged pattern of the first photomask can be developed. This process forms a photoresist pattern (not shown). The first photomask pattern in the photoresist can then be transferred at 540 into the first layer by a first etch. The photoresist can then be removed.

FIG. 6A illustrates an example of a resulting wafer pattern 600a formed in the first layer after the etch 540 of FIG. 5, where a first pattern 300 of FIG. 3 was transferred into the first layer. As shown in FIG. 6A, the wafer pattern 600a includes longitudinal edges that are substantially similar to the longitudinal edges of the drawn pattern. The longitudinal edges 610, 618, 619, 632, 634 and 636 correspond to the longitudinal edges 210, 218, 219, 232, 234 and 236 of the drawn pattern 200. Pattern 614 includes substantially all of the longitudinal edges of segments 212, 214 and 216 of drawn pattern 200.

After forming wafer pattern 600a, a second photoresist layer (not shown) is deposited over wafer pattern 600a. Referring again to FIG. 5, a second exposure process can then be used to transfer the pattern of the second photomask to the second photoresist at 550. For example, the pattern of second mask 400, as shown in FIG. 4, can be transferred to the photoresist at 550 and the photoresist pattern developed, as at 560 of FIG. 5. The second mask 400 can be aligned with the pattern of FIG. 6A during the second exposure so that the resulting image will result in removal of the desired portions of wafer pattern 600a during the subsequent etch process at 570 of FIG. 5. Following the etch process, the remaining photoresist can then be removed at 580 of FIG. 5.

Figure 6B:
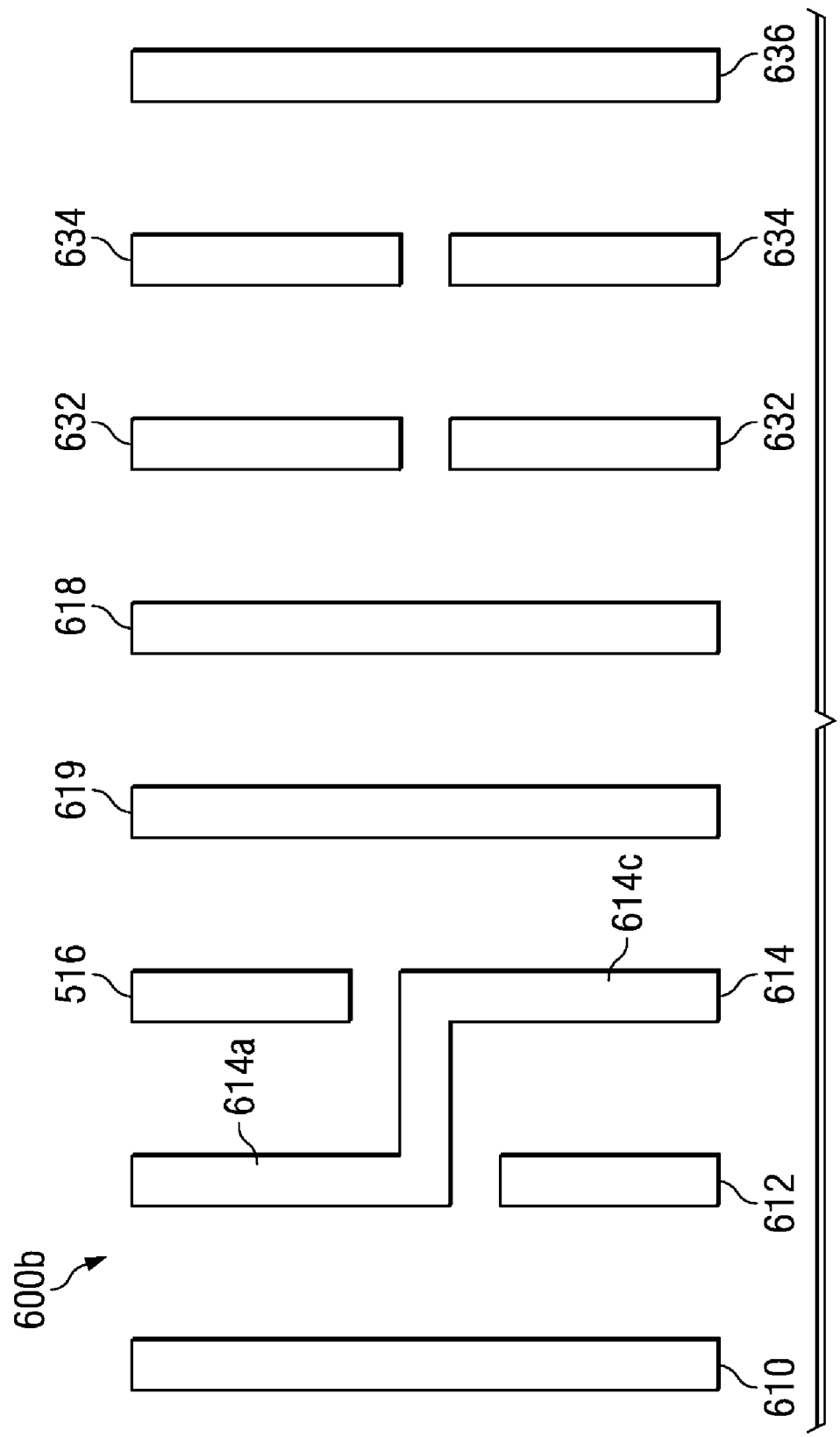
FIG. 6B illustrates a pattern formed on a substrate using both of the photomask patterns illustrated in FIGS. 3 and 4, according to an embodiment of the present application.

FIG. 6B illustrates an example of a resulting wafer pattern 600b. Wafer pattern 600b may be substantially similar to drawn pattern 200, but may include pattern differences that, for example, can occur due to imperfections in the patterning process. As one of ordinary skill in the art would readily recognize, such imperfections may result in, for example, rounded or irregular corners (not shown), where the drawn pattern corners are square. Other pattern differences can include modifications made to the patterns by lithographic engineers to take into account limitations of the lithographic process in implementation of the drawn pattern.

Referring again to FIG. 5, in some embodiments where the first layer at 510 comprises both a hardmask and a device layer, the gate features and other circuit structure features can be transferred first to the hardmask by exposing two separate photoresists using a first pattern and second pattern, as described above. The hardmask pattern is then transferred to the device layer. Exemplary hardmask materials can include silicon oxynitride, silicon nitride, and silicon oxide, and combinations thereof. Alternatively, when a hardmask is not employed, so that, for example, the photoresist is formed directly on the device layer, the gate features and the circuit structure features in the photoresist can be transferred directly to the device layer during the etches at 540 and 570.

FIG. 7 illustrates a system 700 for forming a photomask pattern, according to an embodiment of the present disclosure. System 700 includes a first computer 710 and a second computer 750. Input devices 712,752 and output devices 714, 754 are respectively coupled to computers 710 and 750, which are in turn respectively coupled to databases 716, 756, as shown in FIG. 7. Input devices 712, 752 may comprise, for example, a keyboard, a mouse, and/or any other device suitable for inputting and manipulating data to the respective computers 710 and 750. Output devices 714,754 may comprise, for example, a display, a printer, and/or any other device suitable for presenting data from the respective computers 710 and 750.

Computers 710 and 750 can be personal computers, workstations, networked computers, or any other suitable processing platform. Computers 710 and 750 may include processors 718,758, as shown in FIG. 7. The processor 718, 758 can be implemented using at least one microprocessor from vendors such as Intel, Advanced Micro Devices, Transmeta, IBM, or other circuit manufacturers. In addition, computer 710 can include photomask pattern generation software 720. Computer 750 can include proximity correction software 760.

Photomask pattern generation software 720 and proximity correction software 760 can exist as computer readable software that comprise program instructions in source code, object code, executable code or other formats; program instructions implemented in firmware; or hardware description language (HDL) files. Any of the above can be embodied on a computer readable medium, which include storage devices and signals, in compressed or uncompressed form. Exemplary computer readable storage devices include conventional computer system RAM (random access memory), ROM (read-only memory), EPROM (erasable, programmable ROM), EEPROM (electrically erasable, programmable ROM), and magnetic or optical disks or tapes.

Processor 718 can be configured to control the flow of data between input device 712, output device 714, database 716, and photomask pattern generation software 720. Photomask pattern generation software 720 may receive descriptions of drawn patterns and generate photomask patterns, as described above. After the photomask data is generated, processor 718 can transfer the mask pattern data to computer 750 for further processing. The computers 710, 750 can be coupled together over a network (not shown). The network can be a local area network, a wide area network or a combination thereof. The communication protocol between the computers 710,750 can be implemented with IEEE802.x, token ring, or other similar network protocol.

Processor 758 of computer 750 can be configured to control the flow of data between input device 752, output device 754, database 756, and proximity correction software 760. Proximity correction software 760 can be configured to process the photomask pattern data received from computer 750. Specifically, proximity correction software 760 performs a proximity correction process that corrects the mask pattern data for proximity effects.

Databases 716, 756 may comprise any suitable system for storing data. Databases 716, 756 can be implemented using database technologies from Oracle, Sybase, MySQL or other similar database vendors. Database 716 can store records 724 (data or files) that comprise data associated with the integrated circuit device features and the photomask patterns to be generated, such as data from a design database. Database 756 may store records 764 (data or files) that comprise data associated with the proximity correction process, such as, for example, the photomask pattern data transferred from computer 710.

As discussed above, the processes of the present disclosure, including the process of FIG. 1 above, can be implemented using the photomask pattern generation software 720. However, portions of the processes can potentially also be performed by the proximity correction software 760. For example, the positioning of the SRAF of FIG. 4B can potentially be carried out by proximity correction software 760. Further, it would be readily recognized by one of ordinary skill in the art that different parts of the process can be carried out by the same or different computers. One of ordinary skill in the art would readily be able to write software for performing the processes of the present application.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," include plural referents unless expressly and unequivocally limited to one referent. Thus, for example, reference to "an acid" includes two or more different acids. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. A method for forming an integrated circuit device including a multi-pattern process for patterning a device, comprising:

forming a hardmask or device layer on a substrate;

forming a first photoresist layer over the hardmask or device layer;

imaging a pattern of a first photomask onto the first photoresist layer to pattern the first photoresist layer with a first pattern having longitudinal edges that correspond to longitudinal edges of features in an area of a drawn integrated circuit pattern and substantially all of which are oriented in a first direction;

transferring the first pattern from the first photoresist layer to the hardmask or device layer using a first etch;

forming a second photoresist layer over the hardmask or device layer;

imaging a pattern of a second photomask onto the second photoresist layer to pattern the second photoresist layer with a second pattern having longitudinal edges that correspond to longitudinal edges of features in the area of the drawn integrated circuit pattern and substantially all of which are oriented in a second direction transverse to the first direction; and transferring the second pattern from the second photoresist layer to the hardmask or device layer using a second etch.

2. The method of claim 1, wherein the longitudinal edges of the first pattern correspond to longitudinal edges of gates including dummy gates in the area of the drawn pattern; and the longitudinal edges of the second pattern correspond to slots that define ends of the gates and dummy gates.

* * * * *